US006476692B2

(12) United States Patent
Uchino

(10) Patent No.: US 6,476,692 B2
(45) Date of Patent: Nov. 5, 2002

(54) DISTRIBUTED BALANCED FREQUENCY MULTIPLIER

(75) Inventor: Hideyuki Uchino, Yamanashi (JP)

(73) Assignee: Fujitsu Quantum Devices Limited, Yamanashi (JP)

( * ) Notice: Subject to any disclaimer, the term of this patent is extended or adjusted under 35 U.S.C. 154(b) by 0 days.

(21) Appl. No.: 09/903,811

(22) Filed: Jul. 13, 2001

(65) Prior Publication Data

US 2002/0024411 A1 Feb. 28, 2002

(30) Foreign Application Priority Data

Aug. 18, 2000 (JP) ....................................... 2000-248782

(51) Int. Cl.[7] .................................................. H04B 1/26
(52) U.S. Cl. ....................................... 333/218; 327/119
(58) Field of Search .......................... 333/218; 327/116, 327/119, 122

(56) References Cited

U.S. PATENT DOCUMENTS 4,327,343 A * 4/1982 Cornish ...................... 333/218
4,734,591 A * 3/1988 Ichitsubo ................. 307/219.1
4,754,244 A * 6/1988 Pavio ......................... 333/218
5,392,014 A * 2/1995 Nishida et al. ............. 333/218
6,124,742 A * 9/2000 Cook et al. ................. 327/119

FOREIGN PATENT DOCUMENTS

JP 60-106208 * 6/1985 ................ 455/327
JP 3-158008 A1 8/1991

* cited by examiner

*Primary Examiner*—Benny Lee
*Assistant Examiner*—Barbara Summons

(57) ABSTRACT

A branching section provides a fundamental input wave signal SI of a frequency f to the gate of a FET 15A having a grounded source and the source of a FET 15B having an AC grounded gate, and a signal joining section synthesizes the output signals of the FETs 15A and 15B. An open stub 24 as an amplitude attenuating element is connected to a transmission line 19B of the signal joining section. The length of the open stub 24 is not an integral multiple of λ/4, where λ denotes the wavelength of the fundamental signal SI, and adjusted in simulation such that an amplitude difference between second harmonics included in the drain voltage signals SD1 and SD2 of the respective FETs 15A and 15B is reduced to almost zero. Although the open stub 24 itself is a phase compensating element, since the transfer characteristic of the FET 15B changes by connecting the open stub 24 to the transmission line 19B, the open stub 24 works as an amplitude attenuating element.

12 Claims, 7 Drawing Sheets

VGG1
16A
15A
SD1
19A
D
S
G
13A
14A
12A
23
VDD
22
OUTPUT
11
INPUT
SI
MATCHING CIRCUIT
J1
10
J2
MATCHING CIRCUIT
SO
20
21
12B
14B
SD2
19B
S
D
G
13B
15B
18
17
24
16B
VGG2

INPUT
SI
10
11
MATCHING CIRCUIT
J1
12A
12B
13A
13B
14A
14B
VGG1
16A
15A
G
D
S
SD1
19A
17
15B
S
D
G
SD2
18
16B
VGG2
19B
24
J2
MATCHING CIRCUIT
20
23
VDD
22
OUTPUT
SO
21

SECOND HARMONIC
FUNDAMENTAL
NO STUB
STUB ADDED
2f
f
30
40
50
60
70
80
90
FREQUENCY (GHz)
10
0
−10
−20
−30
−40
−50
−60
POWER (dBm)

VDD
22
OUTPUT
SO
21
23
MATCHING CIRCUIT
20
J2
24
19B
19A
SD1
D
S
15A
G
SD2
D
S
18
16B
G
15B
VGG2
16A
VGG1
12B
17
13A
J1
12B
11
MATCHING CIRCUIT
INPUT
10

INPUT
SI
10
11
MATCHING CIRCUIT
J1
12B
13A
VGG1
16A
G
15A
D
S
SD1
19A
J2
24
17
12B
S
15B
D
G
SD2
18
19B
16B
VGG2
MATCHING CIRCUIT
20
23
VDD
22
OUTPUT
SO
21

INPUT
10
11
MATCHING CIRCUIT
J1
12B
13A
VGG1
16A
15A
D
G
S
SD1
19A
24A
J2
MATCHING CIRCUIT
23
VDD
22
OUTPUT
21
24
17
12B
S
15B
D
G
SD2
19B
18
16B
VGG2

INPUT SI
10
MATCHING CIRCUIT
11
J1
12A
12B
13A
13B
14A
14B
VBB1
16A
15C
B
C
E
19A
J2
MATCHING CIRCUIT
20
VCC
23
22
OUTPUT SO
21
17
15D
E
B
C
18
16B
VBB2
19B
24

DISTRIBUTED BALANCED FREQUENCY MULTIPLIER

BACKGROUND OF THE INVENTION

1. Field of the Invention

The present invention relates generally to a distributed balanced frequency multiplier, more particularly, to a distributed balanced frequency multiplier, for use in microwave or millimeter-wave applications, comprising two transistors as non-inverting and inverting amplifiers constructed by asymmetric connections with respect to each other, and means for correcting a transfer characteristic difference therebetween in high frequencies.

2. Description of the Related Art

FIG. 7 is a circuit diagram of a prior art distributed balanced frequency multiplier circuit. This circuit is analogous to one disclosed in Japanese Patent Publication No. 2807508 B.

A fundamental signal SI having a frequency f is provided to a signal input 10. The input signal SI propagates to a branch point J1, and is provided therefrom to the gate G of a FET 15A and the source S of a FET 15B through first and second input transmission lines, respectively. The source S of the FET 15A is grounded and the gate G of the FET 15B is AC grounded through a capacitor 18. Current signals from the drains D of the FETs 15A and 15B propagates through first and second output transmission lines, respectively, of a joining section to a connection point J2 to be taken out as a signal SO from a signal output 21.

Each gate G of the FETs 15A and 15B is biased at about a pinch-off voltage, and the drain current signals of the FETs 15A and 15B have about half-rectified waveforms. Since the source of the FET 15A is grounded and a signal is provided to the gate thereof, the FET 15A operates as a non-inverting amplifier amplifying a nearly positive half of the input signal. Whereas since the gate of the FET 15B is AC grounded through the capacitor 18 and a signal is provided to the source thereof, the FET 15B operates as an inverting amplifier amplifying a nearly negative half of the input signal.

Hence, in an ideal case, a fundamental and odd harmonics included in the drain current of the FET 15A have reverse phases to respective those of a fundamental and odd harmonics included in the drain current of the FET 15B to cancel out at the join, with the result that none of them are taken out from the signal output 21. Whereas even harmonics included in the drain current of the FET 15A have the same phases and amplitudes as respective those of the FET 15B, and therefore they are added to each other at the join, with the result that only the added even harmonics are taken out from the signal output 21.

Since the amplitude of a fourth order harmonic is considerably smaller compared with that of a second harmonic, the circuit of FIG. 7 is employed as a frequency doubler.

As shown in FIG. 7, by using the FETs 15A and 15B having grounded source and gate, respectively, there is no need to equip, at an input section, a large scale hybrid circuit for generating two fundamentals in reverse phase to each other using an input signal SI. Therefore, the balanced frequency multiplier of FIG. 7 has an advantage of downsizing.

However, the present inventor found that when providing the input signal SI having a frequency of the order of 10 GHz or higher to the balanced frequency multiplier of FIG. 7, a difference in output amplitudes between the FETs 15A and 15B arises and thereby cancellation between fundamentals and between odd harmonics deteriorates with weakening even harmonics at the signal output 21.

FIG. 2 shows power spectra of output signals SO obtained by simulation, wherein square □ denotes the spectrum regarding the circuit of FIG. 7, in a case where a fundamental frequency is 38 GHz.

The present inventor has found as a result of analysis that the cause of the above described problem is asymmetric connection between the FETs 15A and 15B, that is, although there is no problem in low frequencies, an influence of different parasitic components of the transistors increases as frequency increases, causing a difference in transfer characteristics between the FETs 15A and 15B.

SUMMARY OF THE INVENTION

Accordingly, it is an object of the present invention to provide a distributed balanced frequency multiplier capable of suppressing a fundamental and odd harmonics included in an output signal with strengthening even harmonics.

In one aspect of the present invention, there is provided a distributed balanced frequency multiplier comprising: a branching section, having first and second input transmission lines, each of the first and second input transmission lines having first and second ends, the first ends of first and second input transmission lines being coupled to a branch point, distributing a fundamental input signal from the branch point to the first and second input transmission lines; a joining section, having first and second output transmission lines, each of the first and second output transmission lines having first and second ends, the second ends of first and second output transmission line being coupled to a join, synthesizing signals from the first and second output transmission lines at the join; a first transistor, having a control input and a current path, the control input being coupled to the second end of first input transmission line, a first end of the current path being grounded, a second end of the current path being coupled to the first end of first output transmission line; a second transistor, having a control input and a current path, the control input being AC grounded, first and second ends of the current path being coupled to the second end of second input transmission line and the first end of second output transmission line, respectively; and an amplitude attenuating element, for example, an open stab coupled to one of the first input transmission line, the second input transmission line, the first output transmission line, or the second output transmission line.

Although an open stub itself is a phase compensating element, a transfer characteristic of the first or second transistor changes by connecting the open stub to a transmission line on the input or output side of the transistor, and as a result it is considered that the open stub works as an amplitude attenuating element.

The length of an open stub is adjusted such that amplitudes of even harmonics, to be obtained, included in the output signals of the two transistors are almost the same as each other in simulation. Thereby, amplitudes of fundamentals and odd and even harmonics included in the first and second output transmission lines become almost equal to each other in regard to the same frequency components. Further, by performing a prior art phase adjustment method, it is possible to suppress unnecessary fundamental and odd harmonics included in the output and strengthen the amplitudes of even harmonics to be obtained.

Generally, the limitation on the length of the open stub is that it is not an integral multiple of $\lambda/2$ when the open stub is connected on the input side of a transistor, and it is not an integral multiple of λ/4 when the open stub is connected on the output side of a transistor.

Other aspects, objects, and the advantages of the present invention will become apparent from the following detailed description taken in connection with the accompanying drawings.

DESCRIPTION OF THE PREFERRED EMBODIMENTS

Figure 1:
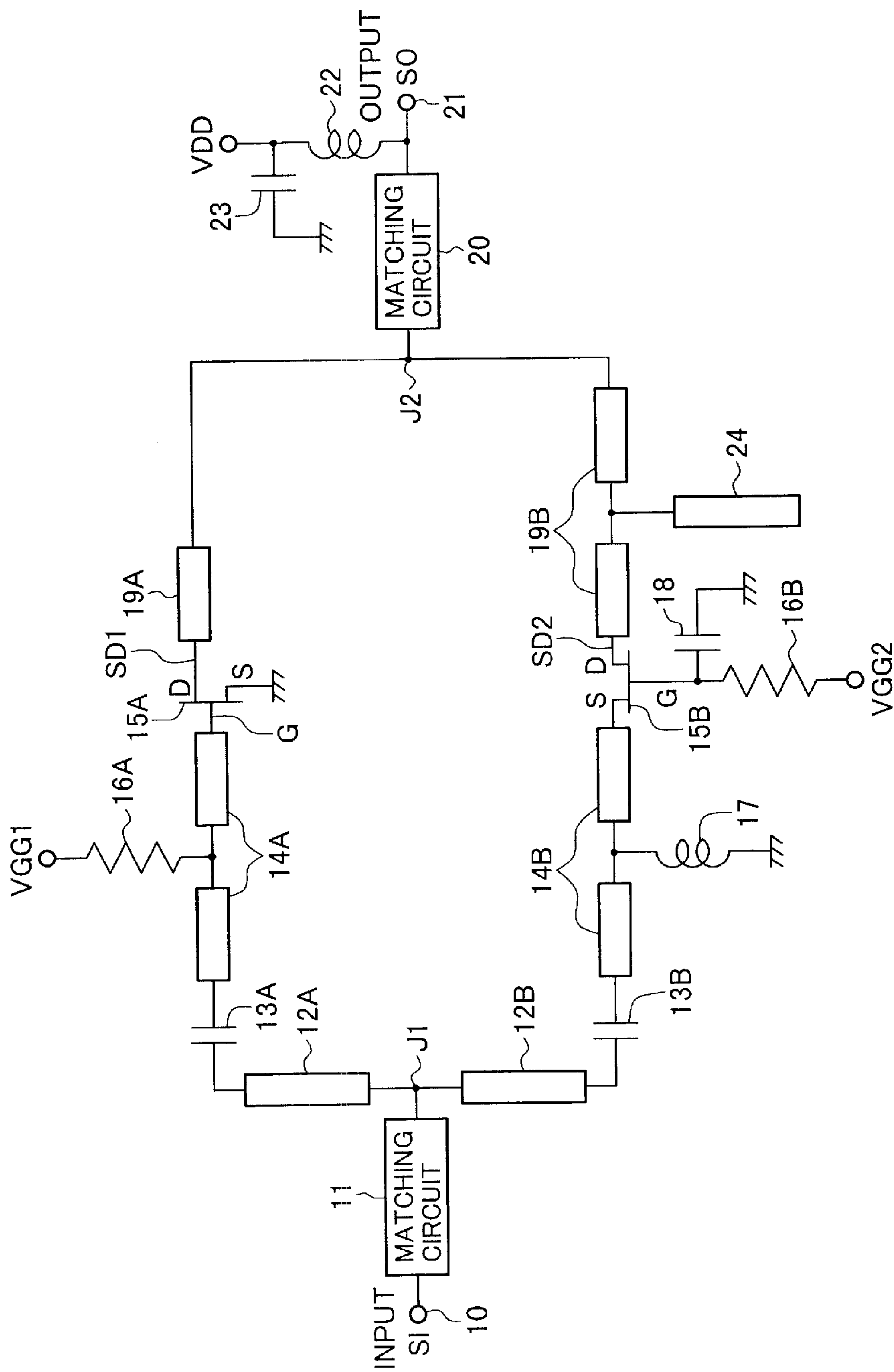
FIG. 1 is a circuit diagram of a distributed balanced frequency multiplier of a first embodiment according to the present invention.

Referring now to the drawings, wherein like reference characters designate like or corresponding parts throughout several views, preferred embodiments of the present invention are described below.

First Embodiment

FIG. 1 is a circuit diagram of a distributed balanced frequency multiplier of a first embodiment according to the present invention. This frequency multiplier is MMIC (Monolithic Microwave Integrated Circuit) for example.

A fundamental signal SI having a frequency f is provided to a signal input 10. The input signal SI passes through a matching circuit 11, reaches a branch point J1, and on one hand propagates through a transmission line 12A, a DC blocking capacitor 13A, and a transmission line 14A to the gate G of a FET 15A, and on the other hand propagates through a transmission line 12B, a DC blocking capacitor 13B, and a transmission line 14B to the source of a FET 15B. A branching section covers from the signal input 10 to the gate G of the FET 15A and to the source of the FET 15B, wherein the transmission line 12A, the capacitor 13A and the transmission line 14A constitutes a first input transmission line, and the transmission line 12B and the capacitors 13B and 14B constitute a second input transmission line.

The FETs 15A and 15B are of a MES type, and of the same shape and size as each other. One end of a bias resistor 16A is connected to the transmission line 14A and a gate bias voltage VGG1 for the FET 1SA is provided from the other end of the bias resistor 16A. The source S of the FET 15A is connected to a grounded conductor. The value of the gate bias voltage VGG1 is determined such that the FET 15A operates near a pinch-off state. The resistance value of the bias resistance 16A is sufficiently larger compared with an impedance value across the gate to source of the FET 15A in order to suppress a signal branching to the bias resistor 16A side.

The transmission line 14B is connected through an AC blocking inductor 17 to a grounded conductor. Thereby, the source S of the FET 15B is DC grounded. The gate of the FET 15B is applied with the gate bias voltage VGG2 through the bias resistor 16B. The gate of the FET 15B is AC grounded through a capacitor 18. The value of the gate bias voltage VGG2 is determined such that the FET 15B operates near a pinch-off state. The resistance value of the bias resistor 16B is sufficiently larger compared with the reactance value of the capacitor 18 in order to suppress a AC signal branching to the bias resistance 16B side.

In regard to an AC component, a signal is provided to the gate of the FET 15A whose source is grounded, whereas a signal is provided to the source of the FET 15B whose gate is AC grounded, and the gates of the FETs 15A and 15B are both biased such that each of them operates near a pinch-off state. Therefore the FET 15A operates as a non-inverting amplifier amplifying a nearly positive half of the input signal, whereas the FET 15B operates as an inverting amplifier amplifying a nearly negative half of the input signal.

In an ideal case, a fundamental and odd harmonics included in the drain current of the FET 15A have reverse phases to respective those of a fundamental and odd harmonics included in the drain current of the FET 15B, whereas even harmonics included in the drain current of the FET 15A have the same phases and amplitudes as respective those of even harmonics included in the drain current of the FET 15B.

The drain D of the FET 15A is connected through a transmission line 19A to one end (a join J2) of a matching circuit 20, and the drain D of the FET 15B is connected through a transmission line 19B to the join J2. The other end of the matching circuit 20 is the signal output 21 of the balanced frequency multiplier. A joining section covers from the drains D of the FETs 15A and 15B to the signal output 21, and the transmission lines 19A and 19B constitutes first and second output transmission lines, respectively.

One end of an AC blocking inductor 22 is connected to the signal output 21, and the drain bias voltage VDD for the FETs 15A and 15B is provided to the other end of the inductor 22. By the inductor 22, a signal having passed through the matching circuit 20 is blocked to branch on the inductor 22 side. The other end of the inductor 22 is connected through a capacitor 23 to the grounded conductor to stabilize the drain bias voltage VDD.

The matching circuits 11 and 20 are constituted of respective transmission lines for example.

As described above, the FETs 15A and 15B are in asymmetric connection with each other, thereby leading to asymmetric operations, and as a input frequency increases, an influence of the parasitic components of the transistors increases, although the influence is not problematic in low frequencies, which causes a difference in transfer characteristics between the FETs 15A and 15B, with the result that the amplitude of the drain voltage signal SD1 of the FET 15A is different from the amplitude of the drain voltage signal SD2 of the FET 15B.

A feature of the first embodiment is that in order to make the amplitudes of the drain voltage signals SD1 and SD2 almost the same as each other, an open stub 24 as an amplitude attenuating element is connected to the transmission line 19B since, as a simulation result, the drain voltage signal SD2 has larger amplitude than that of the SD1. Although the open stub 24 itself is a phase compensating element, since the transfer characteristic of the FET 15B changes by connecting the open stub 24 to the transmission line 19B, as a result it is considered that the open stub 24 works as an amplitude attenuating element.

The length of the open stub 24 is adjusted in simulation such that the amplitudes of second harmonics, to be obtained, included in the drain voltage signals SD1 and SD2 are almost the same as each other. Thereby, each of amplitudes of other frequency components included in the signal passing through the transmission line 19A becomes almost the same as corresponding that included in the signal passing through the transmission line 19B.

A deviation from reverse phases between any one of a fundamental and odd harmonics of a signal passing through the transmission line 19A and a corresponding one of a fundamental and odd harmonics of a signal passing through the transmission line 19B, and a deviation from the same phases between any one of even harmonics of the signal passing through the transmission line 19A and a corresponding one of even harmonics of the signal passing through the transmission line 19B, are caused mainly by connecting the open stub 24 to the transmission line 19B. The deviations can be corrected by adjusting the capacitance value of the capacitor 13A or the capacitor 13B on a design stage, or adjusting a difference in length between the two channels from the branch point J1 to the join J2.

After correcting the deviations in amplitude and phase in such a way, the drain voltage signals SD1 and SD2 are measured on a prototype frequency multiplier, and if amplitudes of both are deviated by a value larger than an allowable value, the process returns to a design stage in order to eliminate the deviations by adjusting the length of the open stub 24. This applies to the case of deviations in phase in a similar manner.

Figure 2:
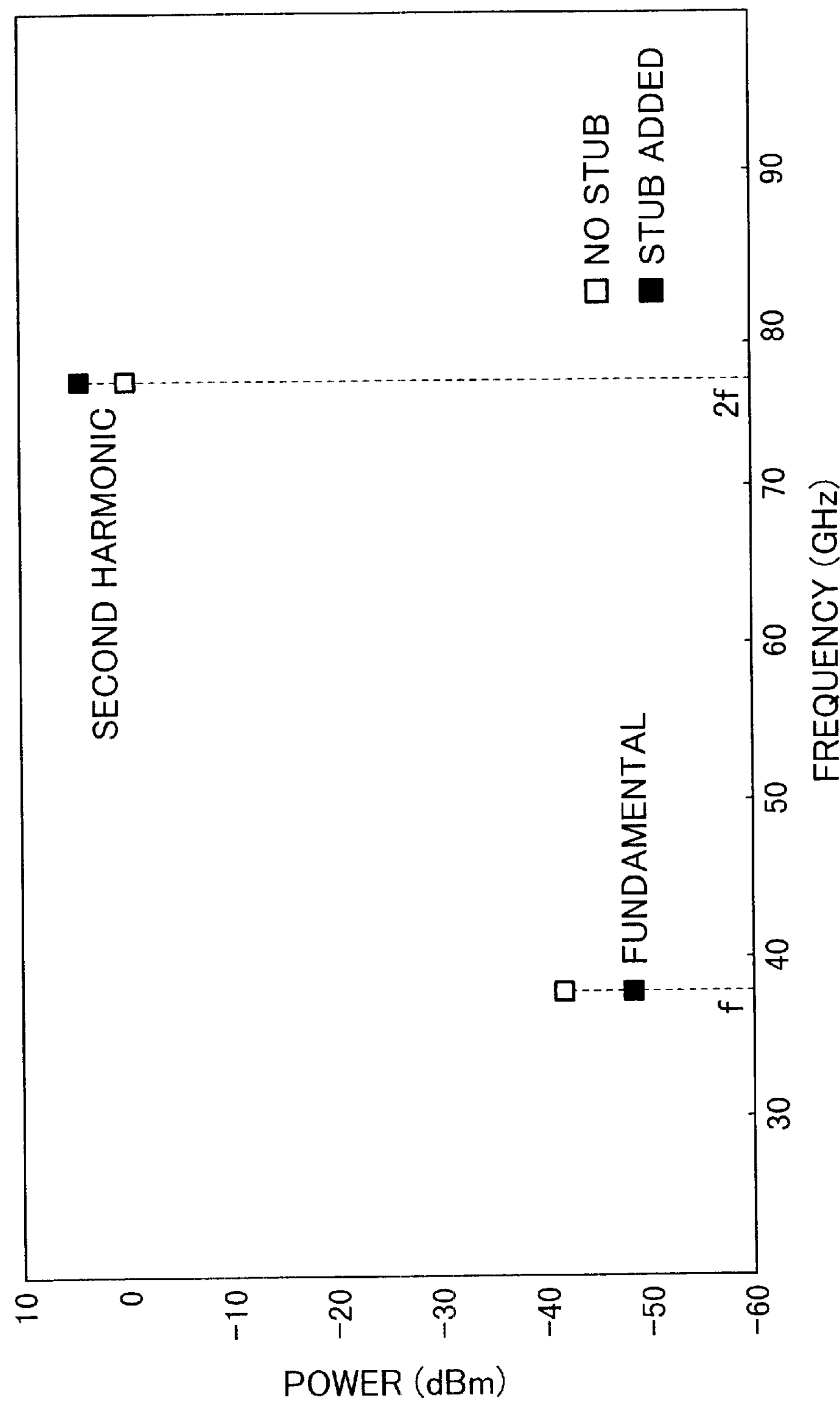
FIG. 2 is a spectral graph of the output signals of circuits of FIGS. 1 and 7 by simulation.
Figure 7:
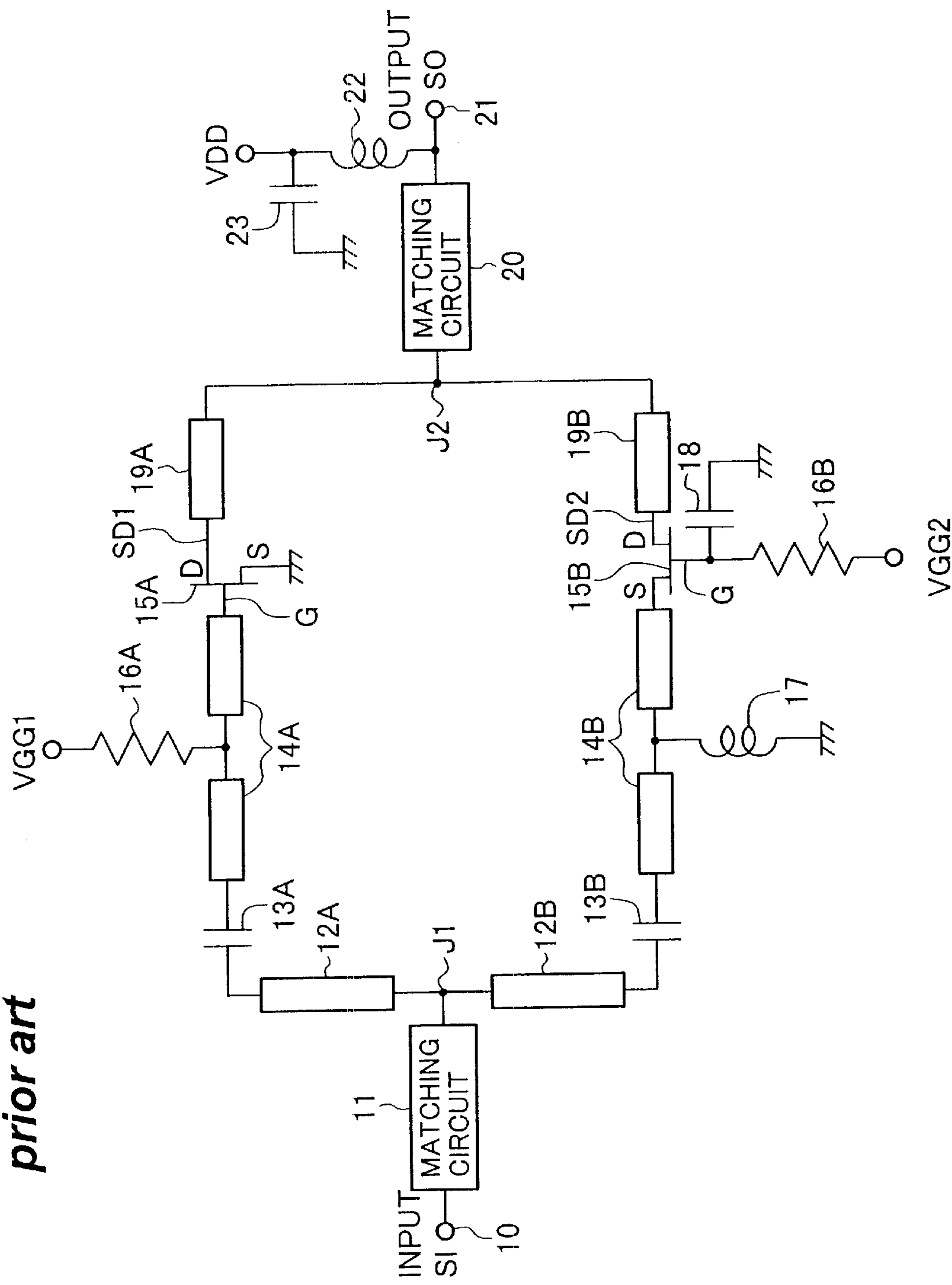
FIG. 7 is a circuit diagram of a prior art distributed balanced frequency multiplier.

FIG. 2 shows power spectra of output signals SO obtained by simulation, wherein square ■ denotes the spectrum regarding the circuit of FIG. 1 and □ the spectrum regarding the circuit of FIG. 7, in a case where a fundamental frequency was 38 GHz, the length of the open stub 24 was adjusted such that the amplitudes of second harmonics included in the respective drain voltage signals SD1 and SD2 were almost the same as each other, in simulation on the circuit of FIG. 1 and furthermore, a difference in length between the two channels from the branch point J1 to the join J2 was adjusted such that the amplitude of second harmonic included in the output signal SO was maximized, in simulations on each of the circuits of FIGS. 1 and 7.

Parameters of the circuits of FIGS. 1 and 7 other than the open stub 24 and the adjusted lengths were set to be the same to each other. The frequency f of the input signal SI was set to 38 GHz, the length of the open stub 24 was 740 mm, and the length from the connected end of the open stub 24 to the drain D of the FET 15B was 45 mm. Letting be the wavelength of a fundamental, $\lambda/4=850$ mm which is longer than the length of the open stub 24.

Generally, the limitation on the length of the open stub 24 is that it is not an integral multiple of $\lambda/4$ and it is preferable to be smaller than $\lambda/4$ for the sake of suppressing increase in chip area of MMIC.

As is clear from FIG. 2, according to the first embodiment of the present invention, it is possible to reduce fundamental unnecessary fundamental in the output signal SO together with increasing the amplitude of a desired second harmonic in the signal.

Second Embodiment

Figure 3:
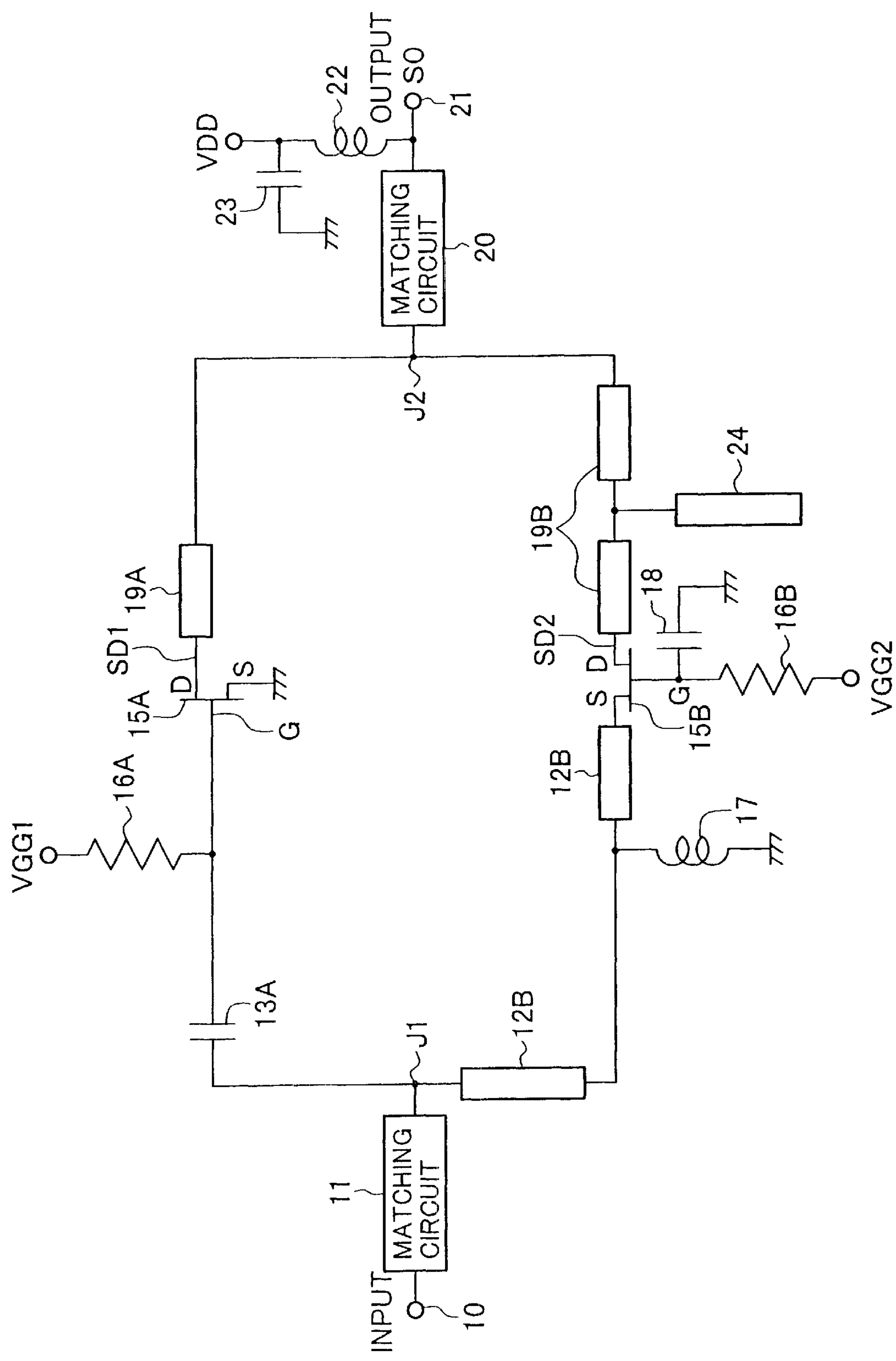
FIG. 3 is a circuit diagram of a distributed balanced frequency multiplier of a second embodiment according to the present invention.

FIG. 3 is a circuit diagram of a distributed balanced frequency multiplier of a second embodiment according to the present invention.

In FIG. 1, flowing of a DC current from the VGG1 to the inductor 17 is blocked by the capacitor 13A even without the capacitor 13B. Therefore, in the circuit of FIG. 3, the capacitor 13B of FIG. 1 is omitted. Further, one electrode of the capacitor 13A is directly connected to one end of the matching circuit 11 and the other electrode of the capacitor 13A is directly connected to the gate G of the FET 15A to omit the transmission lines 12A and 14A of FIG. 1.

The other points are the same as those of the first embodiment.

By omission of the DC blocking capacitor 13B of FIG. 1, the phase of a fundamental at the source S of the FET 15B leads the phase of a fundamental at the gate G of the FET 15A. By connection of the open stub 24, however, the phase of the drain voltage signal SD2 lags as described above, and therefore the deviations of the phases at the input of the matching circuit 20 decreases or comes to zero. Thereby, it is possible that the total length of the transmission lines is made shorter than in the case of the first embodiment, resulting in reducing an occupied circuit area on a chip.

When a phase deviation does not become zero, it is possible to reduce the deviation by adjusting the length of a transmission line or the capacitance value of the capacitor 13A in the design stage as described above.

Third Embodiment

Figure 4:
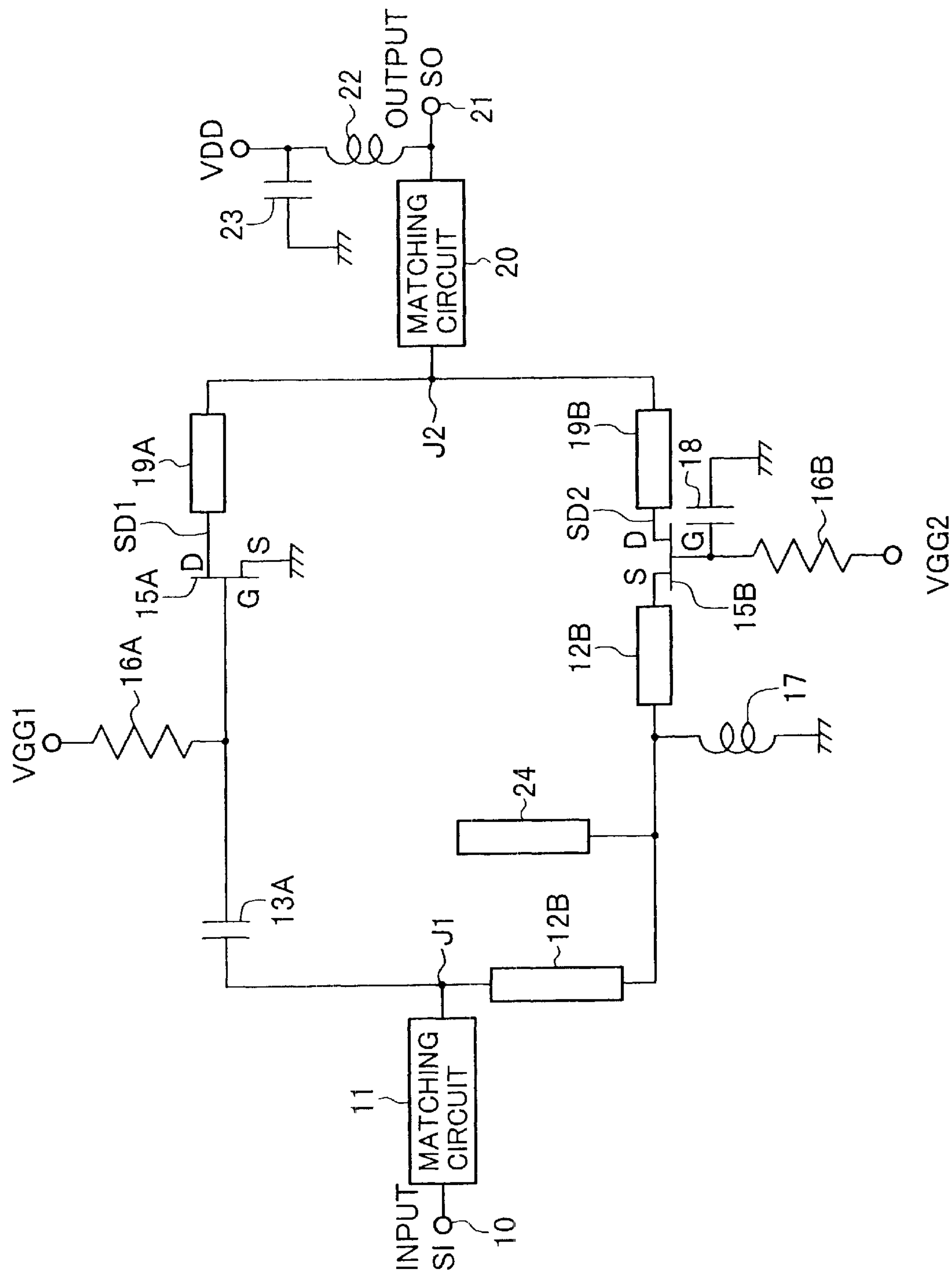
FIG. 4 is a circuit diagram of a distributed balanced frequency multiplier of a third embodiment according to the present invention.

FIG. 4 is a circuit diagram of a distributed balanced frequency multiplier of a third embodiment according to the present invention.

Although the open stub 24 is connected on the output side of the FET 15B in FIG. 3, the open stub 24 is connected to the transmission line 12B on the input side of the FET 15B in the third embodiment.

In this case, generally, the limitation on the length of the open stub 24 is that it is not an integral multiple of $\lambda/2$ and it is preferable to be smaller than $\lambda/2$ for the sake of suppressing increase in chip area of MMIC. Therefore, the first and second embodiments are preferable than the third embodiment in regard to a chip area.

Fourth Embodiment

Figure 5:
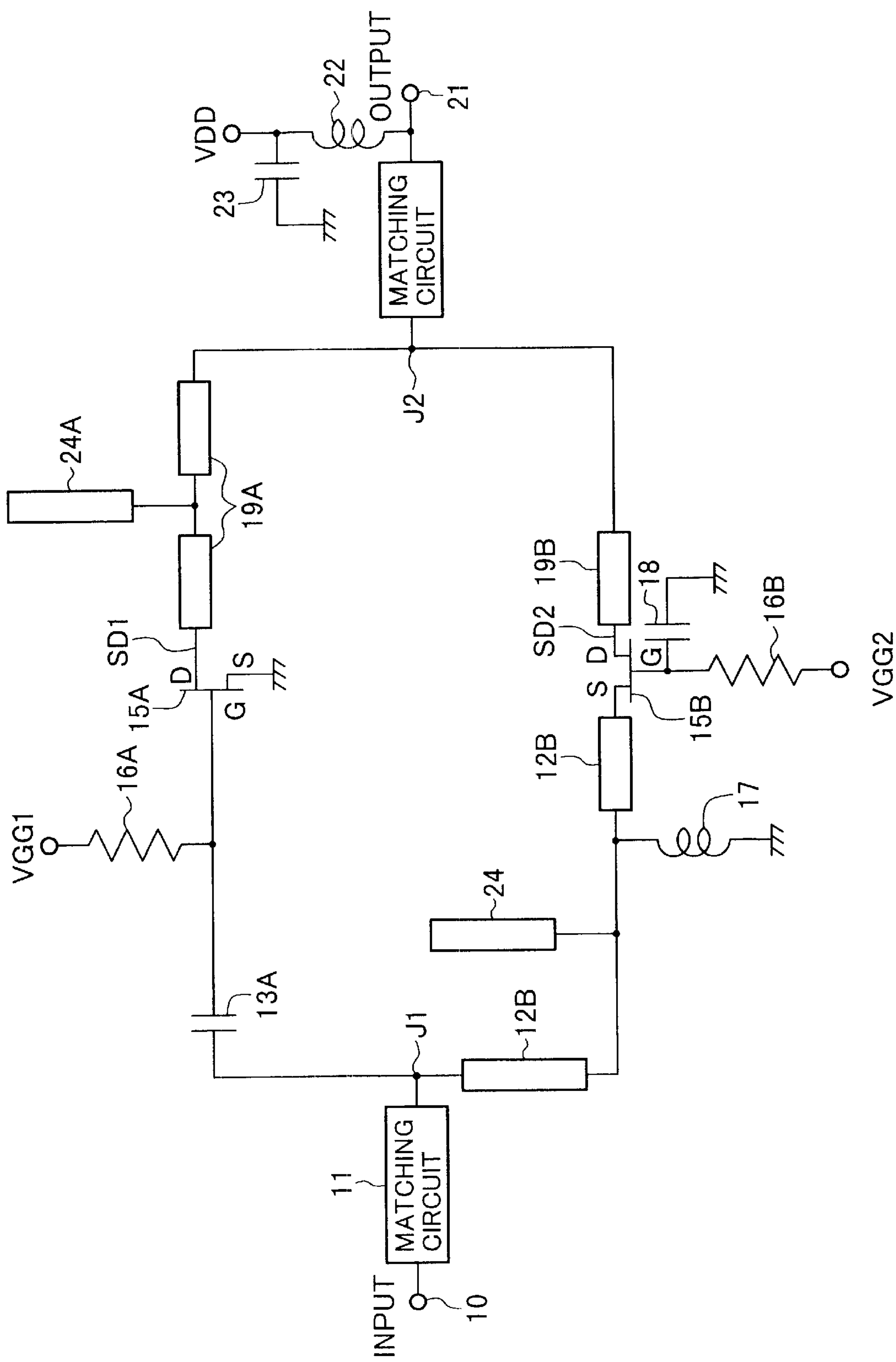
FIG. 5 is a circuit diagram of a distributed balanced frequency multiplier of a fourth embodiment according to the present invention.

FIG. 5 is a circuit diagram of a distributed balanced frequency multiplier of a fourth embodiment according to the present invention.

In order to reduce an amplitude difference between second harmonics, to be obtained, included in the drain voltage signals SD1 and SD2 to almost zero, it is required to connect at least one open stub 24 to a first or second channel between the branch point J1 and the join J2.

In the fourth embodiment, adding to the configuration of FIG. 4, another open stub 24A is connected to the transmission line 19A.

Fifth Embodiment

Figure 6:
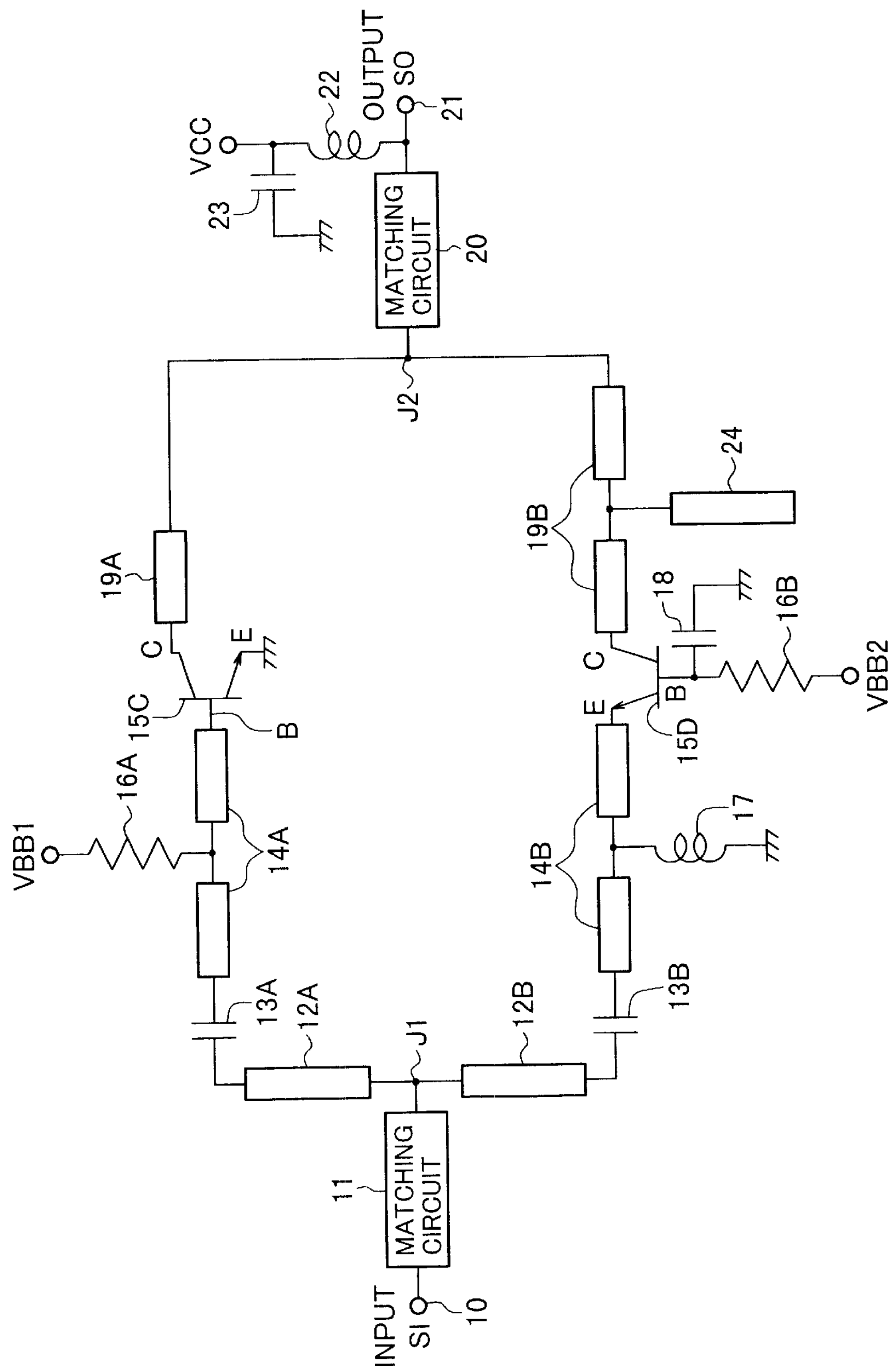
FIG. 6 is a circuit diagram of a distributed balanced frequency multiplier of a fifth embodiment according to the present invention.

FIG. 6 is a circuit diagram of a distributed balanced frequency multiplier of a fifth embodiment according to the present invention.

Transistors used in a distributed balanced frequency multiplier according to the present invention are not limited to FETs, but may be bipolar transistors.

In the circuit of FIG. 6, NPN bipolar transistors 15C and 15D are employed instead of the FETs 15A and 15B, respectively, of FIG. 1. The collector C, base B and emitter E of each bipolar transistor correspond to the drain D, gate G and source S, respectively, of a FET and the base bias voltages VBB1, VBB2 and collector voltage VCC correspond to the gate bias voltages VGG1, VGG2 and the drain voltage VDD, respectively.

The other points are the same as those of the first embodiment.

Although preferred embodiments of the present invention has been described, it is to be understood that the invention is not limited thereto and that various changes and modifications may be made without departing from the spirit and scope of the invention.

What is claimed is:

1. A distributed balanced frequency multiplier comprising:

a branching section, having first and second input transmission lines, each of said first and second input transmission lines having first and second ends, said first ends of first and second input transmission lines being coupled to a branch point, distributing a fundamental input signal from said branch point to said first and second input transmission lines;

a joining section, having first and second output transmission lines, each of said first and second output transmission lines having first and second ends, said second ends of first and second output transmission lines being coupled to a join, synthesizing signals from said first and second output transmission lines at said join;

a first transistor, having a control input and a current path, said control input being coupled to said second end of first input transmission line, a first end of said current path being grounded, a second end of said current path being coupled to said first end of first output transmission line;

a second transistor, having a control input and a current path, said control input being AC grounded, first and second ends of said current path being coupled to said second end of second input transmission line and said first end of second output transmission line, respectively; and an amplitude attenuating element coupled to one of said first input transmission line, said second input transmission line, said first output transmission line, or said second output transmission line.

2. The distributed balanced frequency multiplier of claim 1, wherein said amplitude attenuating element is an open stub coupled to said first or second output transmission line, and a length of said open stub is not an integral multiple of $\lambda/4$, where $\lambda$ denotes a wavelength of said input fundamental signal.

3. The distributed balanced frequency multiplier of claim 2, wherein a length of said open stub is shorter than $\lambda/4$.

4. The distributed balanced frequency multiplier of claim 2, wherein said first transistor is a first field effect transistor having a gate as said control input, a source as said first end of current path, and a drain as said second end of current path, wherein said second transistor is a second field effect transistor having a gate as said control input, a source as said first end of current path, and a drain as said second end of current path.

5. The distributed balanced frequency multiplier of claim 2, wherein said first transistor is a first NPN bipolar transistor having a base as said control input, an emitter as said first end of current path, and a collector as said second end of current path, wherein said second transistor is a second NPN transistor having a gate as said control input, an emitter as said first end of current path, and a collector as said second end of current path.

6. The distributed balanced frequency multiplier of claim 2, wherein said first input transmission line comprises a DC blocking capacitor having first and second electrodes, said first and second electrodes are coupled to said branch point and said control input of first transistor, respectively, wherein said second input transmission line does not comprise a DC blocking capacitor and is DC grounded, wherein said open stub is coupled to said second output transmission line.

7. The distributed balanced frequency multiplier of claim 6, wherein said first transistor is a first field effect transistor having a gate as said control input, a source as said first end of current path, and a drain as said second end of current path, wherein said second transistor is a second field effect transistor having a gate as said control input, a source as said first end of current path, and a drain as said second end of current path.

8. The distributed balanced frequency multiplier of claim 1, wherein said amplitude attenuating element is an open stub coupled to said first or second input transmission line, and a length of said open stub is not an integral multiple of $\lambda/2$, where $\lambda$ denotes a wavelength of said input fundamental signal.

9. The distributed balanced frequency multiplier of claim 8, wherein a length of said open stub is shorter than $\lambda/2$.

10. The distributed balanced frequency multiplier of claim 1, wherein said first transistor is a first NPN bipolar transistor having a base as said control input, an emitter as said first end of current path, and a collector as said second end of current path, wherein said second transistor is a second NPN transistor having a gate as said control input, an emitter as said first end of current path, and a collector as said second end of current path.

11. The distributed balanced frequency multiplier of claim 1, wherein said first transistor is a first field effect transistor having a gate as said control input, a source as said first end of current path, and a drain as said second end of current path, wherein said second transistor is a second field effect transistor having a gate as said control input, a source as said first end of current path, and a drain as said second end of current path.

12. A method of fabricating a distributed balanced frequency multiplier, said distributed balanced frequency multiplier comprising:

a branching section, having first and second input transmission lines, each of said first and second input transmission lines having first and second ends, said first ends of first and second input transmission lines being coupled to a branch point, distributing a fundamental input signal from said branch point to said first and second input transmission lines;

a joining section, having first and second output transmission lines, each of said first and second output transmission lines having first and second ends, said second ends of first and second output transmission lines being coupled to a join, synthesizing signals from said first and second output transmission lines at said join;

a first transistor, having a control input and a current path, said control input being coupled to said second end of first input transmission line, a first end of said current path being grounded, a second end of said current path being coupled to said first end of first output transmission line;

a second transistor, having a control input and a current path, said control input being AC grounded, first and second ends of said current path being coupled to said second end of second input transmission line and said first end of second output transmission line, respectively; and an open stub coupled to one of said first input transmission line, said second input transmission line, said first output transmission line, or said second output transmission line, wherein said method comprising the step of:

adjusting a length of said open stub in simulation such that an amplitude difference between a second harmonic included in a voltage signal at said second end of current path of first transistor and a second harmonic included in a voltage signal at said second end of current path of second transistor decreases.

* * * * *